United States Patent [19]
Atsumi et al.

[11] Patent Number: 5,680,349
[45] Date of Patent: Oct. 21, 1997

[54] NONVOLATILE SEMICONDUCTOR MEMORY DEVICE HAVING ROW DECODER SUPPLYING A NEGATIVE POTENTIAL TO WORD LINES DURING ERASE MODE

[75] Inventors: Shigeru Atsumi; Sumio Tanaka, both of Tokyo, Japan

[73] Assignee: Kabushiki Kaisha Toshiba, Kawasaki, Japan

[21] Appl. No.: 603,273

[22] Filed: Feb. 20, 1996

Related U.S. Application Data

[60] Continuation of Ser. No. 358,714, Dec. 19, 1994, Pat. No. 5,513,146, which is a division of Ser. No. 918,027, Jul. 24, 1992, Pat. No. 5,392,253.

[30] Foreign Application Priority Data

Jul. 25, 1991 [JP] Japan ................... 3-186439

[51] Int. Cl.$^6$ ............................................. G11C 8/00
[52] U.S. Cl. ..................... 365/185.23; 365/185.27; 365/185.29; 365/185.33; 326/108; 327/534
[58] Field of Search ........................ 365/185.23, 185.27, 365/185.29, 185.33, 230.06, 218, 189.09, 189.11; 326/107, 108; 327/534

[56] References Cited

U.S. PATENT DOCUMENTS

| | | | |
|---|---|---|---|
| 4,823,318 | 4/1989 | D'Arrigo et al. | 365/185.23 |
| 5,077,691 | 12/1991 | Haddad et al. | 365/185.23 |
| 5,126,808 | 6/1992 | Montalvo et al. | 365/185.09 |
| 5,157,281 | 10/1992 | Santin et al. | 327/566 |
| 5,168,174 | 12/1992 | Naso et al. | 327/540 |
| 5,265,052 | 11/1993 | D'Arrigo et al. | 365/185.23 |
| 5,267,209 | 11/1993 | Yoshida | 365/185.27 |
| 5,282,176 | 1/1994 | Allen et al. | 365/230.06 |
| 5,287,536 | 2/1994 | Schreck et al. | 365/230.06 |
| 5,295,095 | 3/1994 | Josephson | 365/185.27 |
| 5,295,106 | 3/1994 | Jinbo | 365/218 |
| 5,297,081 | 3/1994 | Challa | 365/185.13 |
| 5,311,480 | 5/1994 | Schreck | 365/230.06 |
| 5,319,604 | 6/1994 | Imondi et al. | 365/185.18 |
| 5,335,200 | 8/1994 | Coffman et al. | 365/218 |
| 5,365,479 | 11/1994 | Hoang et al. | 365/189.09 |

FOREIGN PATENT DOCUMENTS

| | | | |
|---|---|---|---|
| 0 254 139 | 1/1988 | European Pat. Off. | G11C 17/00 |
| 0 314 180 | 5/1989 | European Pat. Off. | G11C 29/00 |
| 0 345 791 | 12/1989 | European Pat. Off. | G11C 17/00 |

OTHER PUBLICATIONS

Mukherjee, et al., "A Single Transistor EEPROM Cell and Its Implementation in a 512K CMOS EEPROM," IEDM 85, pp. 616–619, 1985.

Haddad, et al., "An Investigation of Erase–Mode Dependent Hole Trapping in Flash EEPROM Memory Cell," IEEE, vol. 11, No. 11, pp. 514–516, Nov. 1990.

Ajika, et al., "A 5 Volt Only 16M BIT Flash EEPROM Cell With a Simple Stacked Gate Structure," IEDM 90, pp. 115–118, 1990.

D'Arrigo, et al. "Nonvolatile Memories," ISSCC 89, pp. 132–133, Feb. 16, 1989.

Primary Examiner—David C. Nelms
Assistant Examiner—Andrew Q. Tran
Attorney, Agent, or Firm—Banner & Witcoff, Ltd.

[57] ABSTRACT

A nonvolatile semiconductor memory device is provided in which a negative voltage is applied to a gate electrode of a memory cell transistor during an erase mode. The memory device includes a row decoder circuit having an N-channel transistor connected to a word line. The N-channel transistor is provided on a P-type well region of a semiconductor substrate. A negative voltage is applied to the P-type well region during the erase mode, while ground potential is applied thereto during other modes.

14 Claims, 5 Drawing Sheets

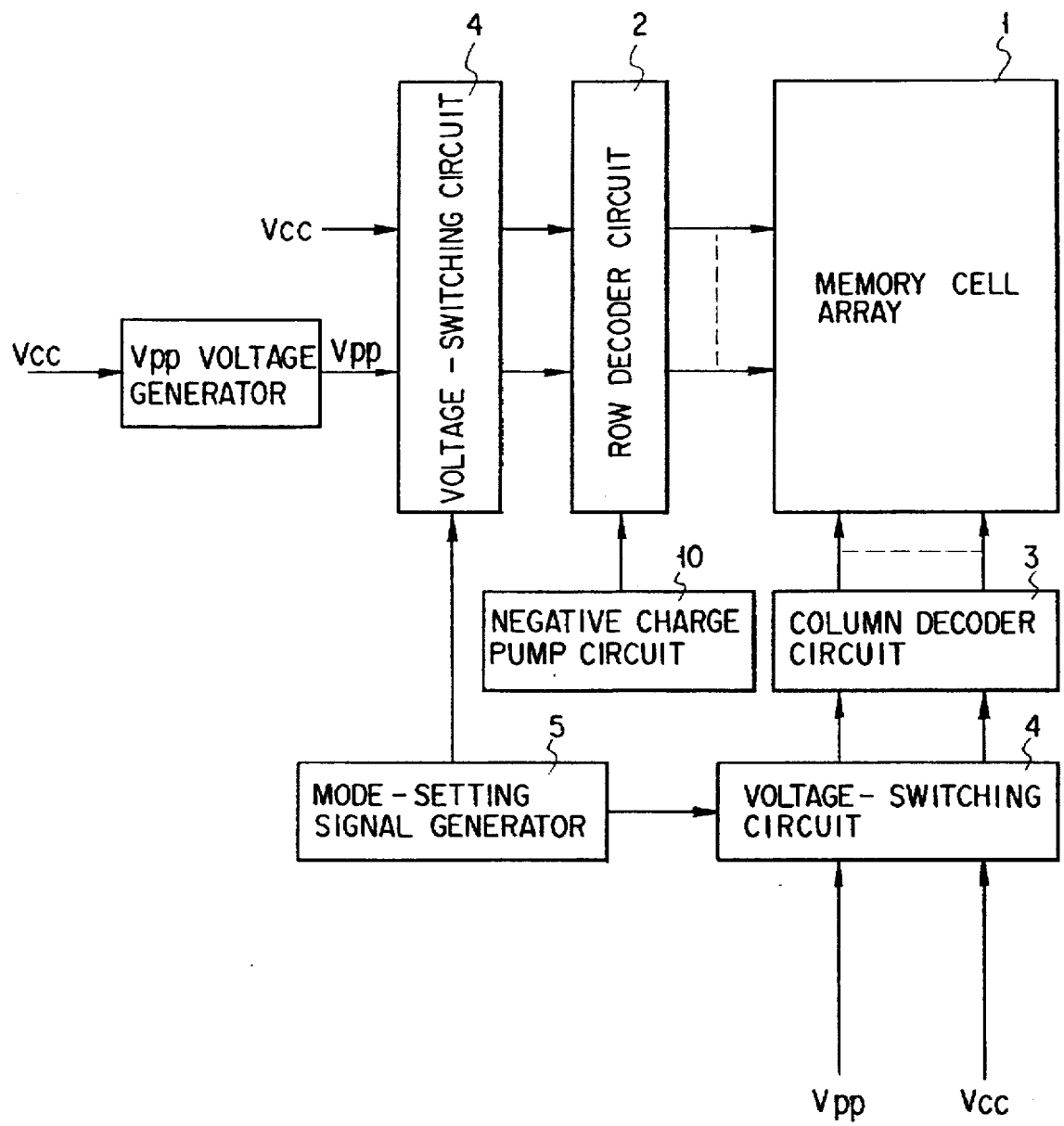
F I G. 1

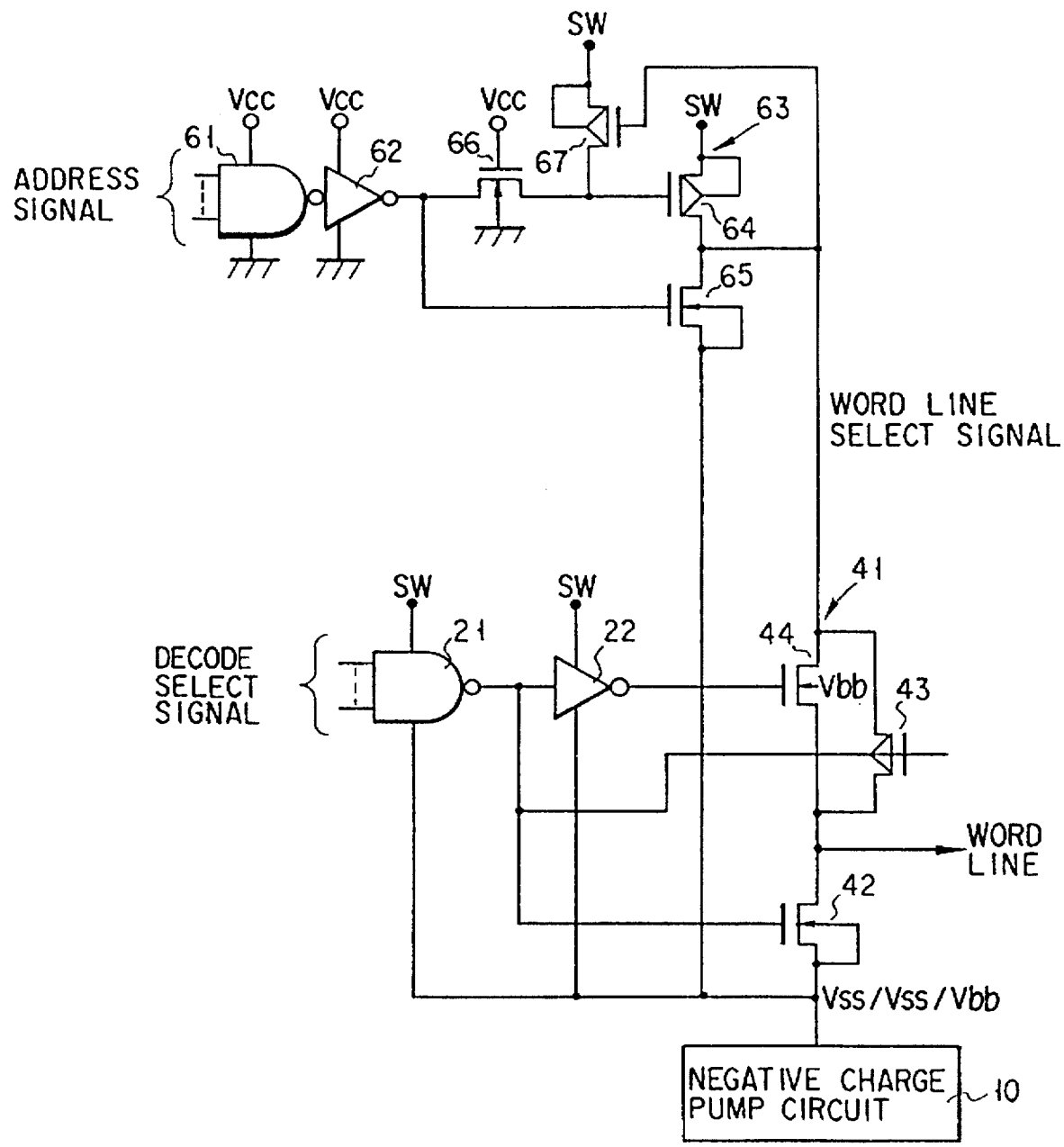
F I G. 6

NONVOLATILE SEMICONDUCTOR MEMORY DEVICE HAVING ROW DECODER SUPPLYING A NEGATIVE POTENTIAL TO WORD LINES DURING ERASE MODE

This application is a continuation of application Ser. No. 08/358,714, filed Dec. 19, 1994, now U.S. Pat. No. 5,513,146 which is a divisional of application Ser. No. 07/918,027, filed Jul. 24, 1992, now U.S. Pat. No. 5,392,253.

BACKGROUND OF THE INVENTION

1. Field of the Invention

This invention relates to an electrically erasable and programmable read-only memory (EEPROM) device, and more particularly to a row decoder circuit in the EEPROM.

2. Description of the Related Art

One typical memory cell used in an EEPROM is a tunnel oxide EPROM cell known as an ETOX-type cell (ETOX is an trademark of Intel Corp.).

In EEPROMs employing ETOX-type cells, writing is carried out with a bit unit, and erasing is performed on all bits by applying a high voltage to the sources of all cells at the same time (flash erase), or erasing is done in the block by simultaneously applying a high voltage to the sources of the cells of the selected block.

FIG. 7 is a sectional view of an ETOX-type cell. Numeral 71 indicates a semiconductor substrate of one conductivity type such as P-type; 72 and 73 source and drain regions of the opposite conductivity type such as N-type, which are selectively provided in the semiconductor substrate 71; 74 a gate insulating film (a tunnel insulating film) provided on the substrate surface; 75 a floating gate (a floating gate electrode) provided above the semiconductor substrate via the gate insulating film 74 between the source and drain regions; and 76 a control gate (a control gate electrode) provided above the floating gate via an interlayer insulating film 77.

The operating principle of the ETOX-type cell has been reported in, for example, S. Mukherjee, et al, "A single transistor EEPROM cell and its implementation in a 512K CMOS EEPROM," IEDM 85, pp. 616–619.

In such a memory cell, during writing (programming) a low voltage (for example, 0V) is given as the source voltage $V_S$; a low voltage (for example, 0V) is applied to the substrate 71; a high voltage $V_{pp}$ (for example, 12V) is given as the control gate voltage $V_{CG}$; and a high voltage is applied as the drain voltage $V_D$. Then, an on-current flows between the drain and source regions, producing pairs of hot electrons and hot holes in the vicinity of the drain region. Those holes flow into the substrate 71 as a substrate current. However, hot electrons are injected into the floating gate 75 to increase the threshold level with respect to the control gate 76, thereby completing the writing operation.

Erasing of data is carried out by applying the high voltage $V_{PP}$ and a low voltage (for example, 0V) to the source region 72 and the control gate 76, respectively, and setting the drain region to, for example, a floating condition. At this state, a floating gate potential $V_{FG}$ is set according to both the ratio of the capacity between the control gate 76 and the floating gate 75 to the capacity between the floating gate 75 and the source region 72, and the source voltage $V_S$. Therefore, Fowler-Nordheim tunnel current flows through the thin tunnel insulating film 74 (approximately 10 nm) provided between the source region 72 and floating gate 75.

Thus, electrons are reduced from the floating gate 75 to complete the erasing operation (the threshold level becomes the condition before writing).

However, the following problems (a) and (b) may occur by applying the high voltage $V_{PP}$ to the source region 72 during erasing:

(a) Since the high voltage $V_{PP}$ is applied to the source region 72 during erasing, a junction breakdown voltage at the side of the source region 72 must be increased. For that purpose, it is necessary that the depth of the source region is made deeper than that of the drain region, or that the impurity concentration of the source region is reduced. The deeper source region would have an adverse effect on device scaling. In fact, when cells designed according to the same design standards are compared in terms of gate length, the gate length of the ETOX-type cell is nearly 0.2 μm longer than that of the normal EPROM cell.

(b) Since the high voltage vpp is applied to the source region 72 during erasing, hot holes are generated near the source region. Some of those hot holes are trapped into the tunnel insulating film 74, reducing the reliability of the cell.

For eliminating the problems (a) and (b), a technique of applying a negative voltage to the control gate 76 during erasing has been proposed by Sameer Haddad, et al., "An Investigation of Erase-Mode Dependent Hole Trapping in Flash EEPROM Memory cell," IEEE Electron Device Letters, Vol. 11, No. 11, November 1990, pp. 514–516, N. Ajika, et al., "A 5 VOLT ONLY 16M BIT FLASH EEPROM CELL WITH A SIMPLE STACKED GATE STRUCTURE," IEDM 90–115, and other related literature. In the technique, for example, −10V is applied to the control gate 76, and, for example, 5V is applied to the source region 72, thereby erasing the data by the tunnel current.

One advantage of the technique is that the junction breakdown voltage at the source side may be low because the voltage applied to the source region 72 during erasing is low. Therefore, it is not necessary that the depth of the source region is made deeper than that of the drain region, or that the impurity concentration of the source region is reduced. Accordingly, it is possible to reduce the gate length of the cell.

During erasing, band-to-band tunneling current (B—B current) flows from the source region 72, and the current value becomes several mA in the whole chip. Therefore, it is difficult to use a step-up circuit. Accordingly, a high voltage $V_{PP}$ for erase must be supplied from an external circuit in the prior art, thereby limiting the application range of EEPROMs. However, it is possible to supply the source voltage from the ordinary power supply $V_{CC}$ during erasure, which provides the advantage of using a 5V single power supply.

Because of its great advantages, the technique described above will be dominant in the future EEPROMs.

A circuit technique of applying a negative voltage to the gate has been proposed by S. D' Arrigo, et al., "A 5V-only 256K Bit CMOS Flash EEPROM (FIG. 5)," ISSCC 89, pp. 132–133. As disclosed here, a word line driver is electrically separated from a word line by a P-channel transistor whose gate is supplied with a negative voltage.

An example of such a circuit is shown in FIG. 8. In the circuit, an ordinary CMOS word line driver is provided by a P-channel transistor 81 and an N-channel transistor 82, and a P-channel transistor 83 is inserted between the output node (the connection node with the word line WL) and the N-channel transistor 82. A negative voltage is applied to the gate of the P-channel transistor 83 during other modes except the erase mode, and the same electric potential as that of the well is applied to the gate thereof during the erase mode. The word line WL is connected to a negative charge pump circuit 85 via a P-channel transistor 84 whose source and gate are connected to each other.

This circuit acts normally as a word line driver. During the erasing operation, the P-channel transistor 81 is turned off to apply a negative voltage to the word line WL through the P-channel transistor 84 from the negative charge pump circuit 85, and the same electric potential as that of the well is applied to the gate of the P-channel transistor 83, thereby turning off the P-channel transistor 83. In this case, since only the $P^+$-type diffused regions of the P-channel transistors 81, 83, and 84 are connected to the word line WL, a forward-biased PN junction is not provided even if a negative voltage is applied to the word line WL.

However, the following problems occur in the circuit technique of separating the word line WL from the N-channel transistor 82 by using the P-channel transistor 83.

(a) The stress applied to the gate oxide film of the P-channel transistor 83 is large.

(b) Since the conductance gm of the P-channel transistor 83 is low, the operation speed of the word line driver is reduced.

(c) Since it is necessary to apply the negative voltage to the gate of the P-channel transistor 83 continuously, it is required to operate the negative charge pump circuit 85 usually. Therefore, the stand-by current can not be reduced to zero.

These problems (a), (b), and (c) will be explained in more detail.

(a) During the writing operation, a high voltage of, for example, 12V is applied to the selected word line, and the unselected word line must be kept at a grounded condition. Therefore, it is necessary that the substrate potential of the P-channel transistor 83 is 12V or more. In this state, for applying the ground potential to the unselected word line through the P-channel transistor 83, it is necessary to apply a high negative voltage (for example, −4V) to the gate of the P-channel transistor 83. At this time, a very high voltage, given by 16V is applied to the gate oxide film of the P-channel transistor 83. For the gate oxide film of the P-channel transistor 83, therefore, there is needed a film thickness (for example, 50 nm) so as not to be subjected to breakdown. Considering that the thickness of the gate oxide film used in transistors designed by 0.8 μm rule is of the order of 20 nm, the application of the thicker thickness to the gate oxide film of the P-channel transistor 83 goes against the device scaling. In addition, if transistors of the memory device are produced in such a manner that only the thickness of the gate oxide film of the P-channel transistor 83 is different from that of other transistors, the manufacturing process may be complicated.

(b) During the reading operation, since a voltage of 5V is applied to the selected word line, 5V or more is required for the substrate potential of the P-channel transistor 83. In this state, for applying the ground potential to the unselected word line through the P-channel transistor, the P-channel transistor is operated under the condition such that the substrate bias voltage of 5V or more is applied thereto. Therefore, since the conductance gm of the P-channel transistor becomes low to reduce the operating speed of the word line driver, it is impossible to increase the operating speed of the row decoder circuit. As noted earlier, the P-channel transistor has a thick gate oxide film, which is disadvantageous for increasing the operating speed of the row decoder circuit.

(c) There have been provided EEPROM applications operated by batteries such as portable computers. In the field, it is impossible to reduce stand-by current to zero.

SUMMARY OF THE INVENTION

An object of the present invention is to provide a nonvolatile semiconductor memory device having an improved word line driver circuit.

Another object of the present invention is to provide a nonvolatile semiconductor memory device having a word line driver circuit without usually operating a negative charge pump circuit.

Still another object of the present invention is to provide a nonvolatile semiconductor memory device having high-speed reading characteristics.

According to an aspect of the present invention, there is provided a nonvolatile semiconductor memory device in which a negative voltage is applied to the gate electrodes of cell transistors during the erase mode. The nonvolatile semiconductor memory device includes a row decoder having an N-channel transistor provided on a P-type well region of a semiconductor substrate. A source region of the transistor is electrically connected to the substrate, and a negative voltage is applied to the P-type well region during the erase mode, while ground potential is applied thereto during the other modes.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIG. 1 is a block diagram showing an EEPROM according to an embodiment of the present invention;

FIG. 6 is a circuit diagram showing a modification of the row decoder circuit of FIG. 4;

DETAILED DESCRIPTION OF THE PREFERRED EMBODIMENTS

Referring to the accompanying drawings, embodiments of the present invention will be described.

FIG. 1 is a block diagram showing an EEPROM according to an embodiment of the present invention. Numeral 1 indicates a memory cell array; 2 a row decoder circuit; 3 a column decoder circuit; 4 a voltage-switching circuit; 5 a mode-setting signal generator; and 10 a negative charge pump circuit.

Figure 2:
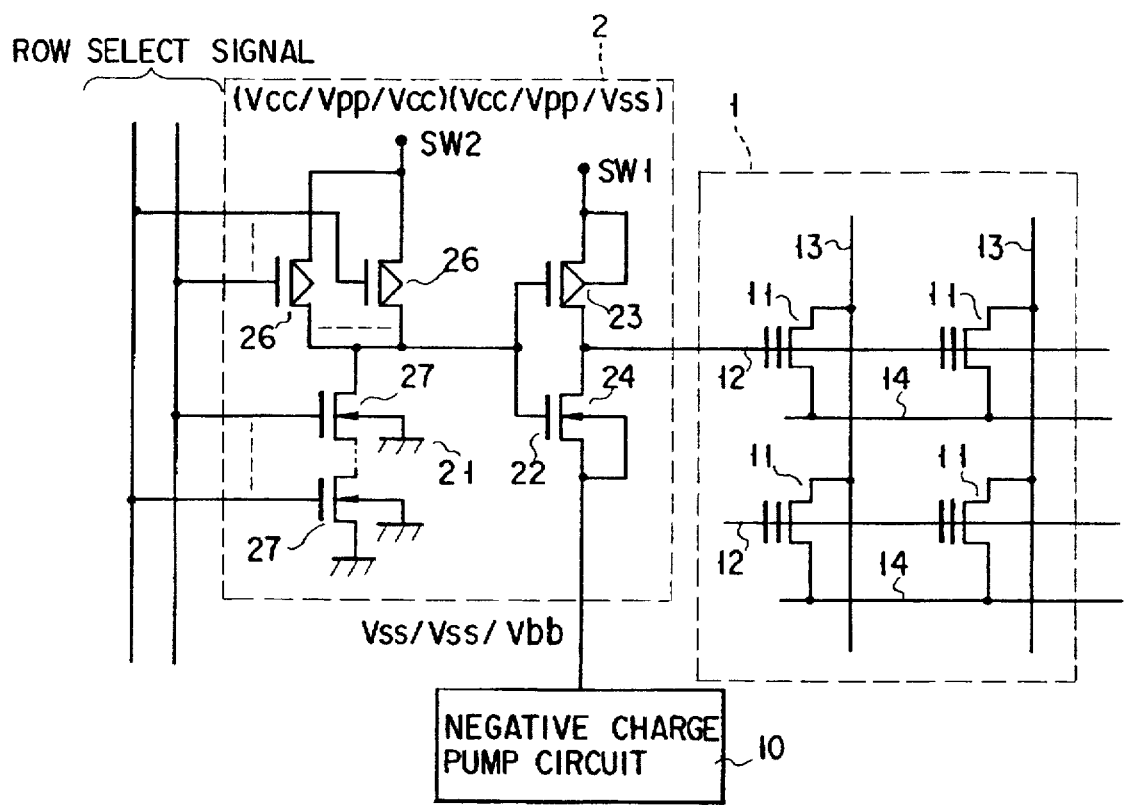
FIG. 2 is a circuit diagram showing a part of the memory cell array and row decoder circuit of FIG. 1.

FIG. 2 shows portions of the memory cell array 1 and row decoder circuit 2. Numerals 11, . . . , it indicate memory cells (for example, ETOX-type cells) arranged in matrix form; 12, . . . , 12 word lines commonly connected to gates of the memory cells 11 arranged in the same row of the memory cell array 1; 13, . . . , 13 bit lines arranged so as to intersect the word lines 12, . . . , 12, and commonly connected to drain regions of the memory cells 11 arranged in the same column of the memory cell array 1; and 14, . . . , 14 source lines commonly connected to source regions of the memory cells 11 arranged in the same row of the memory cell array 1.

In the memory cell array 1, during the read mode, a power supply voltage $V_{cc}$ (for example, 5V) is applied to the selected word line 12, and an intermediate voltage (for example, 1V) is applied to the selected bit line 13. During the write mode, a high voltage $V_{PP}$ (for example, 12V) is applied to the selected word line 12, and a high voltage is also applied to the selected bit line 13. During the erase mode, the power supply voltage $V_{cc}$, for example, is applied to all source lines 14, and a negative voltage $V_{bb}$ (for example, −10V) is also applied to all word lines 12, which brings all bit lines 13 to the floating state.

The row decoder circuit 2, which is provided by a CMOS NAND gate 21 for decoding and a CMOS inverter 22 for a word line driver, decodes a decode select signal, and brings the selected word line to a high level "H" and the unselected word line to a low level "L".

In a P-channel transistor 23 of the CMOS inverter 22, the source region is connected to an N-type well region and further connected to a first internal power supply SW1. The internal power supply SW1 produces $V_{cc}$, $V_{PP}$, and $V_{ss}$ according to the read, write, and erase modes, respectively. In an N-channel transistor 24 of the CMOS inverter 22, the source region is connected to a P-type well region, and further connected to an output node of a negative charge pump circuit 10. The output node of the negative charge pump circuit 10 becomes $V_{ss}$, $V_{ss}$, and a negative voltage $V_{bb}$ according to the read, write, and erase modes, respectively.

A CMOS NAND gate 21 is provided by P-channel transistors 26 connected in parallel and N-channel transistors 27 connected in series, and a decode select signal is applied to gates of these transistors from row select signal lines. Each source region of the P-channel transistors 26 is connected to a second internal power supply SW2 which becomes $V_{cc}$, $V_{PP}$, and $V_{cc}$ according to the read, write, and erase modes, respectively. One end of the group of N-channel transistors 27 connected in series is connected to ground potential $V_{ss}$.

Figure 3:
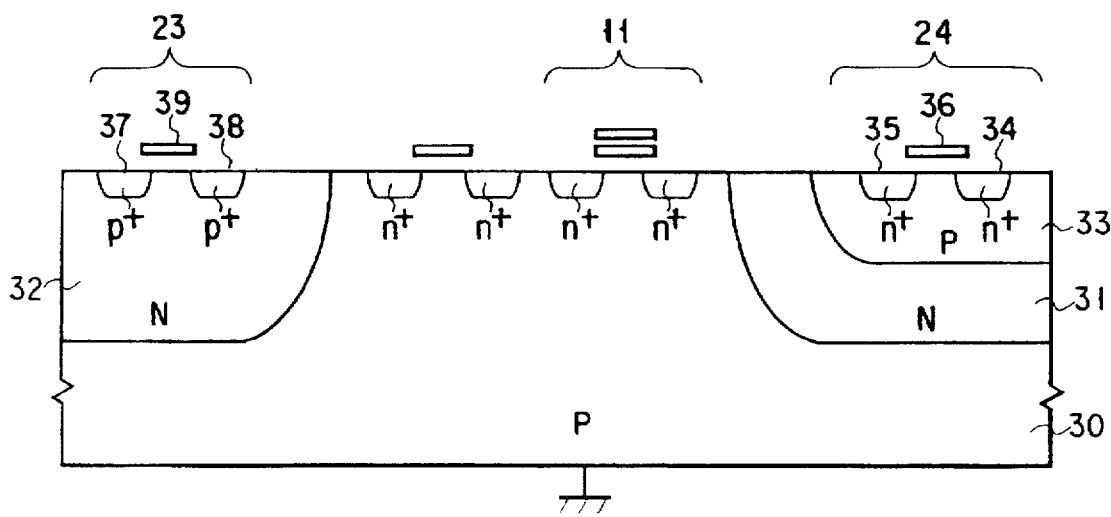
FIG. 3 is a sectional view showing a CMOS inverter and a memory cell of FIG. 2.

FIG. 3 is a sectional view showing portions of the CMOS inverter 22 and memory cell array 1 of FIG. 2. Numeral 30 indicates a P-type semiconductor substrate to which the ground potential $V_{ss}$ is applied. Numerals 31 and 32 represent N-type wells formed in the P-type substrate. These wells may be provided by the same process steps or separate process steps (for example, the N-type well 31 may be first formed to increase the junction depth xj.). Numeral 33 indicates a P-type well formed in the N-type well 31. With the double well structure of N-type well 31 and P-type well 33, the P-type well 33 is electrically isolated from the P-type substrate 30.

The N-channel transistor 24 of the CMOS inverter 22 is provided on the P-type well 33, while the P-channel transistor 23 thereof is provided on the N-type well 32. Numeral 34 indicates a source region of the N-channel transistor 24, which is electrically connected to the P-type well 33. The negative voltage $V_{bb}$ is applied to the source region 34 and the P-type well 33 from the negative charge pump circuit 10 during the erase mode, while the ground potential $V_{ss}$ is applied thereto during other modes. Numeral 35 represents a drain region of the N-channel transistor 24, which is connected to a corresponding word line 12. Numeral 36 indicates a gate of the N-channel transistor 24. Numeral 37 represents a source region of the P-channel transistor 23, which is electrically connected to the N-type well 32. The ground potential $V_{ss}$ is applied to the source region 37 and the N-type well 32 from the internal power supply SW1 during the erase mode, while a positive voltage is applied thereto during other modes. Numeral 38 indicates a drain region of the P-channel transistor 23, which is connected to the drain region 35 of the N-channel transistor 24. Numeral 39 denotes a gate of P-channel transistor 23, which is connected to the gate 36 of the N-channel transistor 24.

The memory cells 11, the CMOS NAND gate 21, and N-channel transistors of other peripheral circuits are directly provided on the P-type substrate 30. The reason for providing the memory cells 11 directly on the P-type substrate 30 is to prevent the substrate potential of the memory cells 11 from being unstable even if substrate current flows during the writing operation.

The operation of the row decoder circuit 2 of FIG. 2 will be explained.

During the read mode, the CMOS inverter 22 corresponding to the word line 12 to be selected receives an input of 0V and provides an output of $V_{cc}$, while the CMOS inverter 22 corresponding to the unselected word lines 12 receives an input of "H" level ($V_{cc}$) and provides an output of 0V.

During the write mode, the CMOS inverter 22 corresponding to the word line 12 to be selected receives an input of 0V and provides an output of $V_{PP}$, while the CMOS inverter 22 corresponding to the unselected word lines 12 receives an input of "H" level ($V_{PP}$) and provides an output of 0V.

During the erase mode, since the internal power supply SW1 and the output node of the negative charge pump circuit 10 become the ground potential vss and the negative voltage $V_{bb}$, respectively, the P-channel transistor 23 of the CMOS inverter 22 is off and the N-channel transistor 24 is on even if the input level is 0V or more, allowing the negative voltage $V_{bb}$ to be applied to the word line 12 via the N-channel transistor 24.

As mentioned above, for increasing the input level of the CMOS inverter 22 to 0V or more, the N-channel transistors 27 of the CMOS NAND gate 21 may be directly formed on the P-type substrate 30. At this time, to minimize the stress applied to the gate oxide film of the N-channel transistor 24 of the CMOS inverter 22, the input level of the CMOS inverter 22 may be provided by 0V. For this purpose, if all of row select signals are rendered by "H" level ($V_{cc}$) during the erase mode, the output of the CMOS NAND gate 21 becomes 0V.

The output voltage of the internal power supply SW1 may be set to $V_{cc}$ during the erase mode in the same manner as that of the internal power supply SW2. In this case, the input level of the CMOS inverter 22 may be set to $V_{cc}$. For this purpose, if all of row select signals are rendered by "L" level (0V) during the erase mode, the output of the CMOS NAND gate 21 becomes $V_{cc}$. At this time, the P-channel transistor 23 of the CMOS inverter 22 is turned off because the gate and the source substrate become the same potential. However, the N-channel transistor 24 of the CMOS inverter 22 is turned on, so that the negative voltage $V_{bb}$ is applied to all word lines 12 through the N-channel transistor 24.

According to the row decoder circuit 2 described above, the negative voltage $V_{bb}$ is applied to the word line 12 via the N-channel transistor 24 during the erase mode. Therefore, it is unnecessary to use the P-channel transistor in which the negative voltage is applied to the gate as shown in the conventional circuit. Accordingly, it is not necessary to always operate the negative charge pump circuit 10, thereby making it possible to reduce stand-by current to zero. The simplified circuit configuration of the word line driver prevents the degradation of access time during the reading operation.

Further, using the CMOS inverter 22 as the word line driver, when the well 32 of the P-channel transistor 23 is intended to be kept at the ground potential $V_{ss}$ during the erase mode, a high voltage of approximately 12V is applied to the word line 12 during the write mode, and approximately −10V is also applied thereto during the erase mode. Therefore, the voltage difference between these two voltages becomes 20V or more. Despite such a large voltage difference, the row decoder circuit 2 and the gates of the MOS transistors of the peripheral circuit are free from excessive stress. In other words, since the maximum voltage applied to the row decoder circuit 2 and the gates of MOS transistors of the peripheral circuitry is approximately 12V, there is no particular need to increase the thickness of the gate oxide film, preventing an increase in the number of manufacturing process steps.

In the embodiment, using the CMOS NAND gate 21 for decoding and the CMOS inverter 22 for the word line driver as the row decoder circuit 2, the negative voltage $V_{bb}$ is applied to the word line 12 via the N-channel transistor 24 of the CMOS inverter 22 during the erase mode. However, the present invention is not limited to this approach. That is, other circuit configurations may be provided such that an N-channel transistor connected to a word line is provided on a P-type well of a semiconductor substrate, and the source region is connected to the P-type well, while applying a negative voltage to the P-type well during the erase mode and applying the ground potential thereto during other modes.

Figure 4:
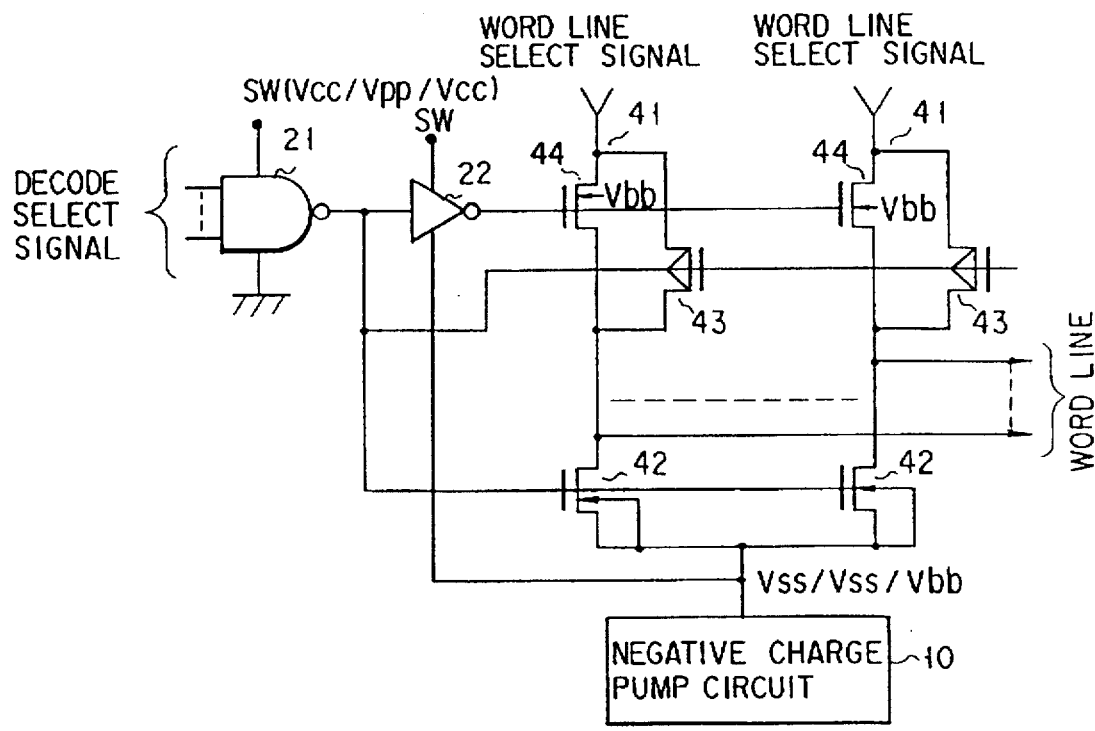
FIG. 4 is a circuit diagram showing another example of the row decoder circuit of FIG. 2.

FIG. 4 shows another example of the row decoder circuit 2. The internal power supply SW provides $V_{cc}$, $V_{pp}$, and $V_{ss}$ according to the read, write, and erase modes, respectively, while the output node of the negative charge pump circuit 10 provides $V_{ss}$, $V_{ss}$, and $V_{bb}$ according to the read, write, and erase modes, respectively. Numeral 21 indicates a CMOS NAND gate for decoding of the SW power supply; 22 a CMOS inverter of the SW power supply; 41 a CMOS transfer gate for a word line driver controlled by the complementary signals from the CMOS NAND gate 21 and CMOS inverter 22; and 42 an N-channel transistor controlled by the output of the CMOS NAND gate 21.

Each of the CMOS transfer gates 41 includes a P-channel transistor 43 and an N-channel transistors 44 connected in parallel with each other. The output node of the CMOS NAND gate 21 is connected to each gate of the P-channel transistors 43, while the output node of CMOS inverter 22 is connected to each gate of the N-channel transistors 44. A word line select signal (drive voltage) is applied to one end of the CMOS transfer gate 41, and the other end thereof is connected to a word line 12.

The N-channel transistor 44 of each of the CMOS transfer gates 41 is provided on the P-type well electrically isolated from the P-type substrate to which the ground potential $V_{ss}$ is applied as described above.

Each of the N-channel transistors 42 is provided on respective P-type wells electrically isolated from the P-type substrate to which the ground potential $V_{ss}$ is applied as described above. The negative charge pump circuit 10 is connected to the source substrate (P-type well), while the drain region is connected to the corresponding word line 12.

As described above, in the CMOS NAND gate 21, the source substrate (N-type well) of the P-channel transistor is connected to the internal power supply SW, the N-channel transistor is directly provided on the P-type substrate, and the source region is connected to the ground potential $V_{ss}$.

In the CMOS inverter 22, further, the source substrate (N-type well) of the P-channel transistor is connected to the internal power supply SW, the N-channel transistor is provided on the P-type well electrically isolated from the P-type substrate to which the ground potential $V_{ss}$ is applied, and the source substrate (P-type well) is connected to the negative charge pump circuit 10.

The operation of the FIG. 4 circuit will be explained.

During the read mode, the CMOS NAND gate 21 corresponding to a word line to be selected 12 provides an output of 0V, and the CMOS inverter 22 of the next stage provides an output of $V_{cc}$. This causes the CMOS transfer gate 41 for the word line driver to be turned on, and the N-channel transistor 42 to be turned off, thereby allowing a word line select signal to be applied to the word line 12 via the CMOS transfer gate 41. On the other hand, the CMOS NAND gate 21 corresponding to the unselected word line 12 provides an output of $V_{cc}$, and the CMOS inverter 22 of the next stage provides an output of 0V. Therefore, the N-channel transistor 42 is turned on and the CMOS transfer gate 41 is turned off. The ground potential $V_{ss}$ is then applied to the word line 12 via the N-channel transistor 42.

During the write mode, the CMOS NAND gate 21 corresponding to the word line to be selected 12 provides an output of 0V, and the CMOS inverter 22 of the next stage provides an output of $V_{pp}$. Therefore, the CMOS transfer gate 41 is turned on, and the N-channel transistor 42 is turned off. The word line select signal is then applied to the word line 12 via the CMOS transfer gate 41. On the other hand, the CMOS NAND gate 21 corresponding to the unselected word line 12 provides an output of $V_{pp}$, and the CMOS inverter 22 of the next stage provides an output of 0V. Therefore, the N-channel transistor 42 is turned on and the CMOS transfer gate 41 is turned off. Accordingly, the ground potential $V_{ss}$ is applied to the word line 12 via the N-channel transistor 42.

During the erase mode, if all decode select signals are intended to become "H" level, the output of the CMOS NAND gate 21 becomes 0V, and the P-channel transistor of the CMOS inverter 22 is turned off because the gate and the source/substrate become the same potential. On the contrary, the N-channel transistor of the CMOS inverter 22 is turned on to provide an output of the negative voltage $V_{bb}$. As a result, the N-channel transistor 42 is turned on, and the CMOS transfer gate 41 is turned off, whereby the negative voltage is applied to the word line 12 via the N-channel transistor 42.

When the output voltage of the internal power supply SW has been changed to the voltage of the read power supply voltage $V_{cc}$ during the erase mode, the output of the CMOS NAND gate 21 becomes $V_{cc}$ if all of the decode select signals become "L" level during the erase mode. In this case, the P-channel transistor of the CMOS inverter 22 is turned off since the gate and the source substrate become the same electric potential, and the N-channel transistor of the inverter 22 is turned on. Therefore, since the output of the inverter 22 becomes the negative voltage $V_{bb}$, the CMOS transfer gate 41 is turned off and the N-channel transistor 42 is turned on.

Accordingly, the negative voltage is applied to the word line 12 via the N-channel transistor 42.

Further, when the negative voltage $V_{bb}$ is applied to the word line 12 during the erase mode, the word line 12 is kept at the unselected condition in the circuit of FIG. 4. However, the circuit may be modified so that the word line 12 may be kept at the selected condition. An example is shown in FIG. 5.

Figure 5:
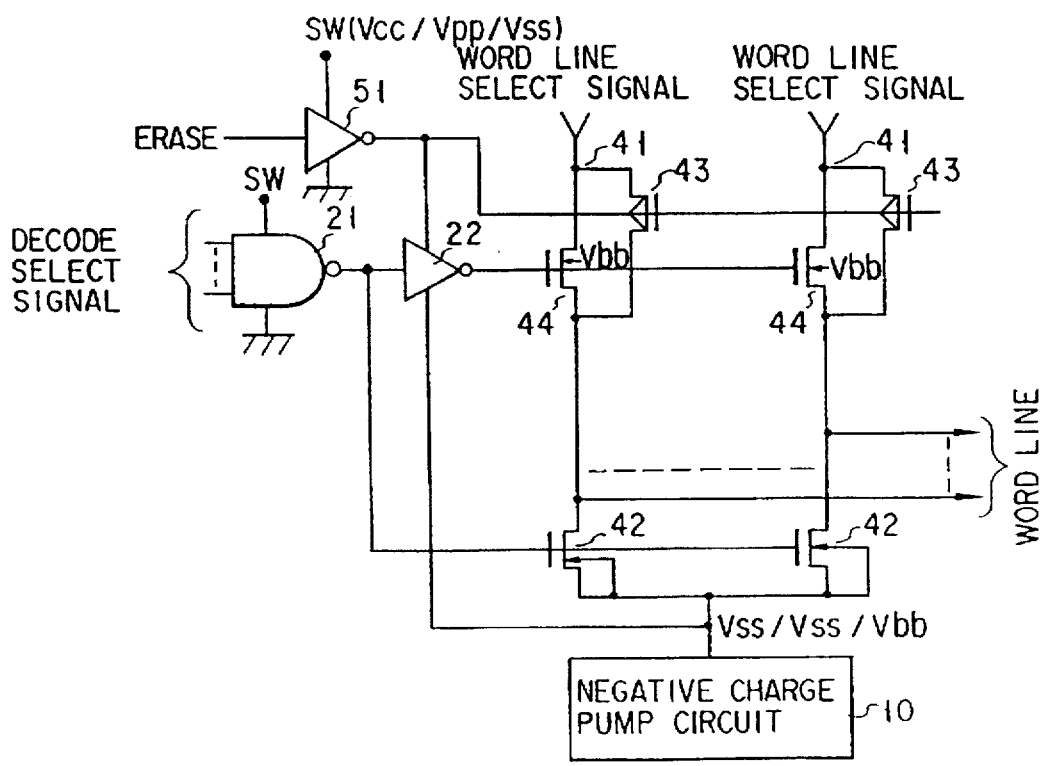
FIG. 5 is a circuit diagram showing still another example of the row decoder circuit of FIG. 2.
Figure 7:
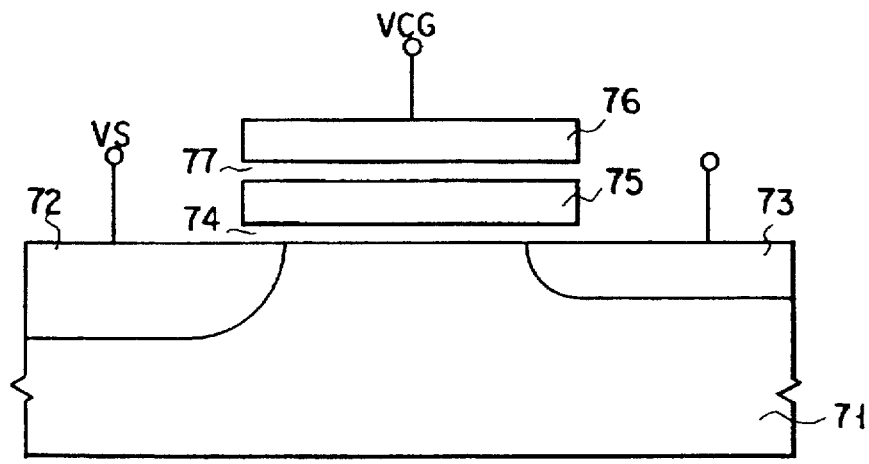
FIG. 7 is a sectional view showing a conventional ETOX-type cell.
Figure 8:
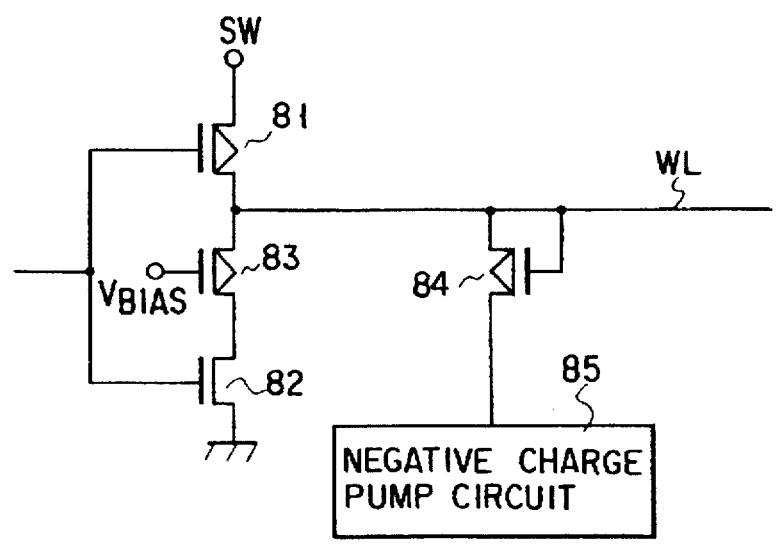
FIG. 8 is a circuit diagram showing a portion of the row decoder of a conventional EEPROM.

In the circuit of FIG. 5, the internal power supply SW/ground potential $V_{ss}$ are connected to a CMOS inverter 51 supplied with an erase mode signal, corresponding to high and low potential power supply nodes of the inverter 51. The output of the inverter 51, which becomes $V_{cc}$, $V_{PP}$ and $V_{ss}$ according to the read, write and erase modes, respectively, is applied to a high potential power supply node of the COMS inverter 22, and is further applied to the gate of the P-channel transistor 43 of the CMOS transfer gate 41 instead of the output of the CMOS NAND gate 21.

In the circuits of FIGS. 4 and 5, the word line select signal during the erase mode is 0V. However, it may be considered that the word line select signal is a voltage lower than 0V. An example is shown in FIG. 6.

The circuit of FIG. 6 includes a row decoder circuit provided by partially modifying the circuit of FIG. 4, and a word line drive voltage source for supplying one of the word line select signals to the row decoder circuit. Here, the same parts as those in FIG. 4 are indicated by the same reference characters.

In the row decoder circuit of FIG. 6, the substrate (P-type well) of the N-channel transistor of the CMOS NAND gate 21 for decoding is electrically isolated from the P-type substrate in the same manner as the substrate (P-type well) of the N-channel transistor 42, and is connected to the negative charge pump circuit 10.

Numeral 61 indicates an AND gate of $V_{cc}$ power supply for predecode to which an address signal is applied and a CMOS inverter 62 of the $V_{cc}$ power supply is connected. Numeral 63 represents a CMOS inverter of the SW power supply, whose output node supplies the word line select signal. The P-channel transistor 64 of the CMOS inverter 63 has the source region and substrate both connected to the SW power supply. The N-channel transistor 65 of the CMOS inverter 63 is electrically isolated from the P-type substrate and, is connected to the negative charge pump circuit 10, together with the source region, in the same manner as the substrate (P-type well) of the N-channel transistors 42. The output node of the CMOS inverter 62 is connected to the gate of the N-channel transistor 65 as well as to the gate of the P-channel transistor 64 of the CMOS inverter 63 via the N-channel transistor 66 for a transfer gate. The N-channel transistor 66 has the gate connected to the $V_{cc}$ power supply, and the substrate is also connected to the $V_{ss}$ potential. Numeral 67 indicates a P-channel transistor, whose source and substrate are both connected to the internal power supply SW, whose drain is connected to the gate of the P-channel transistor 64 of the CMOS inverter 63, and whose gate is connected to the output node of the CMOS inverter 63.

In the circuit of FIG. 6, the signal of the $V_{cc}$ power supply is converted into the word line select signal of the SW power supply during the write and read operations, and is supplied to the word line, while the negative voltage $V_{bb}$ is applied to the word line during the erase operation.

The present invention may be applied to EEPROMs capable of erasing the cell array blocks by dividing the array divided into blocks. In this case, the negative voltage $V_{bb}$ is applied only to the word line in the block selected during the erase mode in the circuits of FIGS. 2, 4, 5, and 6.

As described above, according to the nonvolatile semiconductor memory device of the present invention, the negative voltage is applied to the word line via the N-channel transistor during the erase mode, which does not require the P-channel transistor in which the negative voltage is applied to the gate as shown in the conventional circuit. Therefore, it is unnecessary to always operate the negative charge pump circuit, thereby making it possible to reduce the stand-by current to zero. Further, the simplified circuit configuration of the word line driver prevents the degradation of access time during the reading operation.

Further, in the case where, using the CMOS inverter as the word line driver, the ground potential is applied to the substrate of its P-channel transistor during the erase mode, no transistors undergo excessive stress, thereby making it unnecessary to use a transistor having a special film thickness.

What is claimed is:

1. A method for operating a row decoder circuit, connected to first and second potential nodes, for use with a semiconductor memory device, said row decoder circuit, including a logic circuit for decoding a select signal and a word line driver circuit having an N-channel transistor, for applying a negative voltage supplied to said second potential node to a word line during an erase mode and for applying a positive potential supplied to said first potential node to said word line during a write mode, the method comprising the steps of:

selecting said word line connected to a memory cell to be erased in accordance with the select signal decoded by said logic circuit;

applying to said first potential node a potential lower than the positive potential supplied to said first potential node during the write mode; and applying the negative voltage to said word line via said N-channel transistor.

2. The method according to claim 1, further comprising the step of applying the negative voltage to a substrate of said N-channel transistor.

3. The method according to claim 1, wherein the negative voltage is applied to said word line via said N-channel transistor when a high level signal is applied to a gate of said N-channel transistor.

4. A method for operating a row decoder circuit which applies potentials to a word line of a nonvolatile semiconductor memory device, said row decoder circuit connected to first and second potential nodes and comprising a logic circuit for decoding a select signal and a word line driver circuit having an N-channel transistor including a first current terminal connected to said second potential node, the method comprising the steps of:

selecting said word line in accordance with the select signal decoded by said logic circuit during a write mode and applying a positive word line potential to said word line during the write mode, wherein during the write mode a positive first potential is supplied to said first potential node and a second potential to said second potential node; and selecting said word line in accordance with the select signal decoded by said logic circuit during an erase mode and applying a negative word line potential to said word line during the erase mode, wherein during the erase mode a third potential, which is lower than the positive first potential, is supplied to said first potential node and a negative fourth potential to said second potential node.

5. The method according to claim 4, comprising the further step of:

selecting said word line in accordance with the select signal decoded by said logic circuit during a read mode and applying a positive word line potential to said word line during the read mode, wherein during the read mode a positive fifth potential is supplied to said first potential node and the second potential to said second potential node.

6. The method according to claim 4, wherein the second potential is the ground potential.

7. The method according to claim 4, wherein said row decoder circuit further includes a P-channel transistor having a first current terminal connected to said first potential node.

8. The method according to claim 7, wherein a second current terminal of said N-channel transistor and a second current terminal of said P-channel transistor are connected to said word line.

9. The method according to claim 4, wherein the third potential is the ground potential.

10. The method according to claim 4, wherein said logic circuit comprises a NAND gate.

11. The method according to claim 4, wherein said word line driver circuit comprises an inverter and said N-channel transistor is part of said inverter.

12. The method according to claim 4, wherein the positive word line potential applied to said word line during the write mode is approximately 12 volts.

13. The method according to claim 4, wherein the negative word line potential applied to said word line during the erase mode is approximately −10 volts.

14. The method according to claim 4, wherein said N-channel transistor is formed in a P-type well formed in an N-type well, wherein said N-type well is formed in a P-type semiconductor material.

\* \* \* \* \*